(12) United States Patent
Koschmieder et al.

(10) Patent No.: US 7,067,907 B2
(45) Date of Patent: Jun. 27, 2006

(54) SEMICONDUCTOR PACKAGE HAVING ANGULATED INTERCONNECT SURFACES

(75) Inventors: Thomas H. Koschmieder, Austin, TX (US); Terry E. Burnette, New Braunfels, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 125 days.

(21) Appl. No.: 10/401,171

(22) Filed: Mar. 27, 2003

(65) Prior Publication Data

US 2004/0188812 A1    Sep. 30, 2004

(51) Int. Cl.
*H01L 23/02* (2006.01)
(52) U.S. Cl. ...................... 257/678; 257/784
(58) Field of Classification Search .............. 257/686, 257/688, 689, 700, 692–697, 678, 777, 778, 257/783; 361/736, 743, 745, 748–751
See application file for complete search history.

(56) References Cited

U.S. PATENT DOCUMENTS

| | | | | |
|---|---|---|---|---|
| 5,147,208 A | * | 9/1992 | Bachler | 439/67 |
| 5,288,235 A | * | 2/1994 | Sobhani | 439/67 |
| 5,394,013 A | * | 2/1995 | Oku et al. | 257/786 |
| 5,940,729 A | * | 8/1999 | Downes et al. | 438/613 |
| 6,022,758 A | | 2/2000 | Badehi | |
| 6,040,235 A | | 3/2000 | Badehi | |
| 6,117,758 A | | 9/2000 | Kazumi | |
| 6,150,255 A | * | 11/2000 | Downes et al. | 438/613 |
| 6,166,333 A | * | 12/2000 | Crumly et al. | 174/255 |
| 6,184,060 B1 | * | 2/2001 | Siniaguine | 438/106 |
| 6,287,893 B1 | | 9/2001 | Elenius et al. | |
| 6,441,487 B1 | | 8/2002 | Elenius et al. | |
| 6,939,315 B1 | * | 9/2005 | Sherman et al. | 601/41 |
| 6,939,737 B1 | * | 9/2005 | Palanisamy | 438/106 |
| 2002/0194731 A1 | * | 12/2002 | Anderson | 29/852 |

OTHER PUBLICATIONS http://www.amkor.com/products/notes_papers/appnotes_LGA_0902.pdf.

* cited by examiner

*Primary Examiner*—Tuan H. Nguyen
(74) *Attorney, Agent, or Firm*—Joanna G. Chiu; Robert L. King

(57) ABSTRACT

Improved electro-mechanical connections between a packaged semiconductor die (12) and a printed circuit board (60) with reduced standoff height and pitch are created by the use of a non-planar semiconductor package substrate (24) having a surface with angulated portions. Electrically conductive surfaces (54) are formed over the angulated portions. In one embodiment, the electrically conductive surfaces may be formed by forming an electrically conductive surface (54) over a non-planar or angulated package substrate (42). The electrically conductive angulated surfaces improve reliability of solder joints (70) upon connecting the packaged semiconductor die to the printed circuit board (60). The gaps within the solder mask openings provide a thin profile and improved pitch. In one form, the die may be on a same side of the package as the angulated substrate surface.

17 Claims, 4 Drawing Sheets

SEMICONDUCTOR PACKAGE HAVING ANGULATED INTERCONNECT SURFACES

FIELD OF THE INVENTION

The present invention relates generally to semiconductor packaging and more specifically, to a semiconductor package having angulated interconnect surfaces.

RELATED ART

In forming electrical circuits, packaged semiconductor die are typically connected to printed circuit boards (PCB). Currently, solder may be used to provide an electromechanical connection between the packaged semiconductor die and the PCB. For example, in one process available today, solder balls are used to provide this connection between the packaged semiconductor die and PCB. In order to ensure a reliable connection, large volume solder balls (e.g. a solder ball having a diameter of at least 250 microns) are used. However, these large volume solder balls increase the standoff height between the packaged semiconductor die and the PCB. This interferes with applications that require a total thin profile. Also, as the pitch (defined here as the center to center spacing between neighboring solder balls) decreases, the larger solder balls may lead to electrical shorts between neighboring balls. Therefore, a need exists for an improved electromechanical connection between packaged semiconductor die and PCBs that allows for reduced standoff height and decreased pitch.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

One embodiment of the present invention allows for improved electro-mechanical connections between packaged semiconductor die and PCBs. This also allows for reduced standoff height and pitch. One embodiment provides for electrically conductive angulated or non-planar surfaces within solder mask openings. For example, in one embodiment, the electrically conductive surfaces are formed over angulated portions of a non-planar package substrate. The resulting electrically conductive angulated surfaces allow for improved solder joints upon connecting the packaged semiconductor die to a PCB. Alternatively, the resulting electrically conductive surface overlying the angulated portions of a non-planar package substrate may themselves be planar. In this embodiment, the angulated portions of the non-planar package substrate also provide for improved connectivity and reliability.

Figure 1:
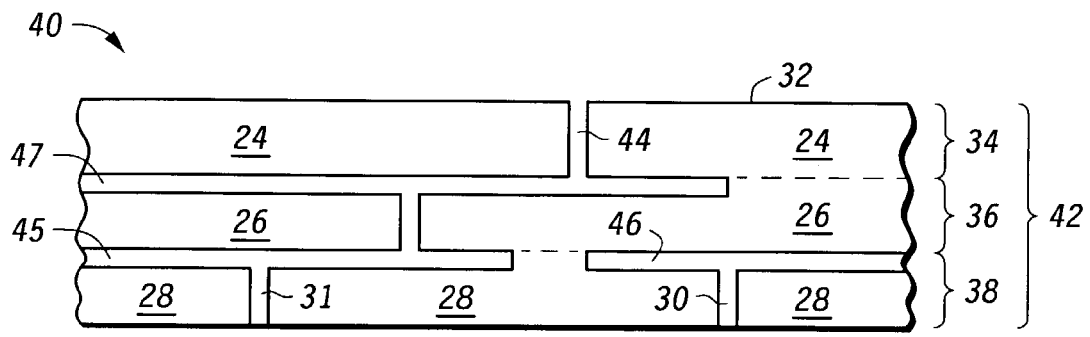
FIG. 1 illustrates a cross-sectional view of a semiconductor package, in accordance with one embodiment of the present invention.

FIG. 1 illustrates a cross-sectional view of a semiconductor package 40 in accordance with one embodiment of the present invention. Semiconductor package 40 includes a package substrate 42, where package substrate 42 includes substrate interconnect layers 38, 36, and 34. Interconnect layer 38 includes intralayer conductive portions 45 and 46 which may be used to route signals within a same layer and interlayer conductive portions 31 and 30 (also referred to as electrically conductive vias) which may be used to route signals between different layers. Interconnect layer 38 also includes insulating portions 28 which isolate the conductive portions, as needed. Similarly, interconnect layer 36 includes conductive portion 47 which includes interlayer and intralayer conductive portions. Interconnect layer 36 also includes insulating portions 26 which isolate the conductive portions, as needed. Interconnect layer 34, being the final interconnect layer in the illustrated embodiment, includes intralayer conductive portion 44, which, as will be describe below, may be used to provide an electrical connection to a conductive surface overlying a first surface 32 of package substrate 42. Note that in one embodiment, interconnect layer 34 includes intralayer conductive portion 44; however, in an alternate embodiment, the opening (i.e. the via) for forming intralayer conductive portion 44 may not yet be filled or plated with a conductive material. In this embodiment, an unfilled opening represented by 44 would exist instead, to be filled or plated later in the process. Interconnect layer 34 also includes isolating portions 24 which isolate the conductive portions, as needed.

In one embodiment, package substrate 42 is formed by stacking interconnect layers, such as interconnect layers 38, 36, and 34. For example, each interconnect layer may be a laminate layer, as known in the art, which may be attached to each other using an adhesive, glue, epoxy, or the like. In one embodiment, each laminate layer is first drilled to form openings that will correspond to the desired intralayer conductive portions. For example, if interconnect layer 38 were a laminate layer, then the laminate layer would include openings corresponding to intralayer conductive portions 31 and 30. In one embodiment, after attaching a laminate layer (or after providing the first laminate layer), the interlayer and intralayer conductive portions are formed by filling or plating the openings to form the interlayer conductive portions and masking and plating the surface to form the intralayer conductive portions, as known in the art. Alternatively, the intralayer conductive portions may be formed by plating or depositing a conductive material, and then masking and etching using conventional processes, to form the desired intralayer conductive portions. Note also that in the illustrated embodiment, the intralayer conductive portions of interconnect layers 36 and 38 are located at one surface of interconnect layers 36 and 38, respectively. However, in alternate embodiments, intralayer conductive portions may be located at the opposite surface of each of interconnect layers 36 and 38, or alternatively, at both surfaces of interconnect layers 36 and 38. The same applies for interconnect layer 34, although, in the illustrated embodiment, only one interlayer conductive portion 44 (or opening if not yet filled or plated) is shown.

Note that package substrate 42 may be formed in a variety of different ways using a variety of different processes and materials. For example, isolated portions 24, 26, and 28 of package substrate 42 may be formed of an organic or ceramic material. For example, they may be formed of polyimide tape, high temperature co-fired ceramic, low temperature co-fired ceramic, fiberglass reinforced plastic, or any other types of plastics. Also, note that conductive portions 31, 30, 45, 46, 47, and 44 may be formed of any conductive material or combination of conductive materials. For example, they may be formed from copper, gold, silver, aluminum, palladium, or any other conductive metal or metal alloy. Alternatively, they may be formed from a conductive polymer. Also, package substrate 42 may be formed using conventional depositing, masking, and etching processes rather than the laminate process described above. Note also that alternate embodiments may include any number of interconnect layers (i.e. one or more) which may be used to route signals through package substrate 42. Also, note that each interconnect layer may have any type of routing where the interlayer conductive portions and intralayer conductive portions may be arranged as needed for providing the appropriate routing required for a particular design.

Figure 2:
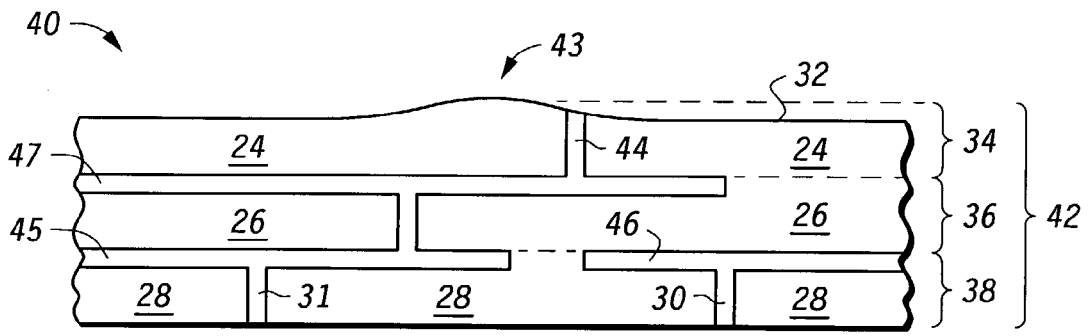
FIG. 2 illustrates a cross-sectional view of the semiconductor package of FIG. 1 after forming an angulated portion to form a non-planar package substrate, in accordance with one embodiment of the present invention.

FIG. 2 illustrates package substrate 42 after formation of an angulated portion 43 and thus resulting in a non-planar package substrate. That is, in the illustrated embodiment, surface 32 of package substrate 42 is non-planar. As will be described in reference to subsequent figures below, conductive surfaces will be formed over the angulated portions such as angulated portion 43 to form interconnects that can be used to connect package substrate 42 to a PCB. Therefore, angulated surface portions such as portion 43 may be formed along surface 32 such that they correspond to places where conductive surfaces will later be formed. The angulated portions such as portion 43 may be formed in a variety of different ways. In the illustrated embodiments of FIGS. 1 and 2, a package substrate is formed as shown in FIG. 1, and then portions of an exterior surface such as surface 32 are etched (e.g. anisotropically etched) to form the angulated portions. Alternatively, interconnect layer 34 may be etched to form non-planar surface 32 prior to being attached to interconnect layers 36 and 38. In yet another embodiment, if a laminate process is used, the final interconnect layer, such as interconnect layer 34, may be molded into the desired resulting shape (i.e. having an angulated portion or portions) and then attached to the package substrate. Alternatively, package substrate 42 can be formed by first forming interconnect layer 34 in a mold which creates the angulated portions, and then subsequent interconnect layers such as interconnect layers 36 and 38 may be attached or formed on top of interconnect layer 34, thus forming package substrate 42 in an inverted fashion.

In yet an alternate embodiment, portions may be added to a package substrate (such as package substrate 42 of FIG. 1) to form the angulated portions. For example, either conductive or insulating materials (or a combination thereof) may be formed overlying portions of surface 32 to form angulated portions rather than etching back portions of interconnect layer 34 or molding interconnect layer 34. Also note that in some embodiments, interlayer conductive portion 44 may already be filled or plated or may still be just an opening in FIG. 2. Also, intralayer conductive portion 44 (or just the opening, if not yet filled or plated) may be located in a variety of different locations within interconnect layer 34, as needed. For example, it can be centered within angulated portion 43, or off-center, as illustrated in FIG. 2.

Figure 3:
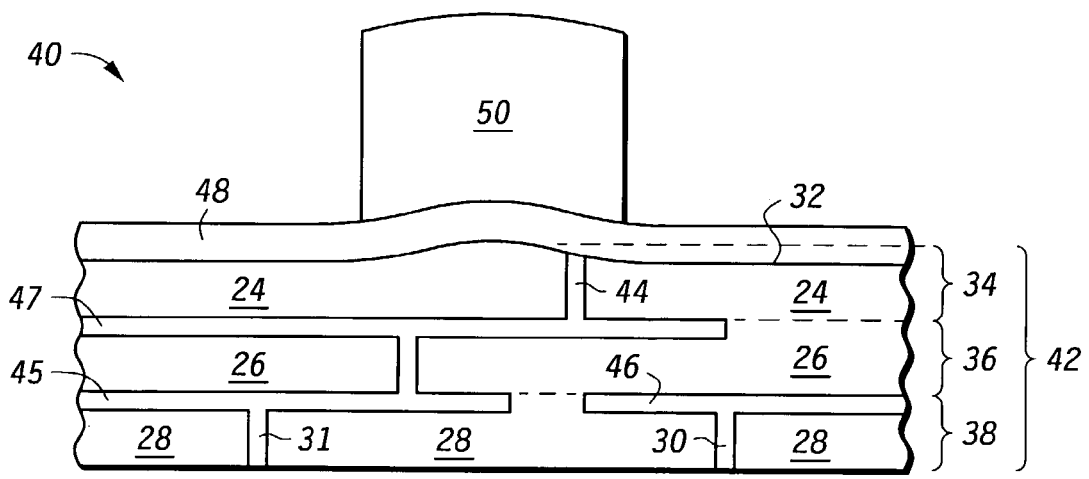
FIG. 3 illustrates a cross-sectional view of the semiconductor package of FIG. 2 after formation of a conductive layer and a patterned masking layer over the non-planar package substrate in accordance with one embodiment of the present invention.

FIG. 3 illustrates a cross-sectional view of semiconductor package 40 after formation of a conductive layer 48 overlying surface 32 of package substrate 42 and a patterned masking layer 50 overlying conductive layer 48. Conductive layer 48 may be formed of any conductive material or combination of conductive materials. For example, conductive layer 48 may be formed from copper, gold, silver, aluminum, palladium, tin, lead, nickel, tungsten, or any other conductive metal or metal alloy. Alternatively, conductive layer 48 may be formed from a conductive polymer. Also note that conductive layer 48 may be formed in a variety of ways. For example, in one embodiment, conductive layer 48 may include a seed layer formed over the second surface of package substrate 42 which is then electroplated to form conductive layer 48. Alternatively, electroless plating may be used to form conductive layer 48. Alternatively, conductive layer 48 may be blanket deposited such that it conforms to the non-planar surface of package substrate 42 using, for example, chemical-vapor deposition (CVD), physical-vapor deposition (PVD), plasma enhanced CVD, sputtering, and the like. Note also that in the embodiment where the openings in interconnect layer 34 have not yet been plated or filled, they may be plated or filled during the formation of conductive layer 48 to form interlayer conductive portion 44, as known in the art. Patterned masking layer 50 is used to define the places where a resulting conductive surface is desired. These resulting conductive surfaces may then be used to provide electrical connections, such as to a PCB. In one embodiment, patterned masking layer 50 may be a patterned photo resist or hard mask.

Figure 4:
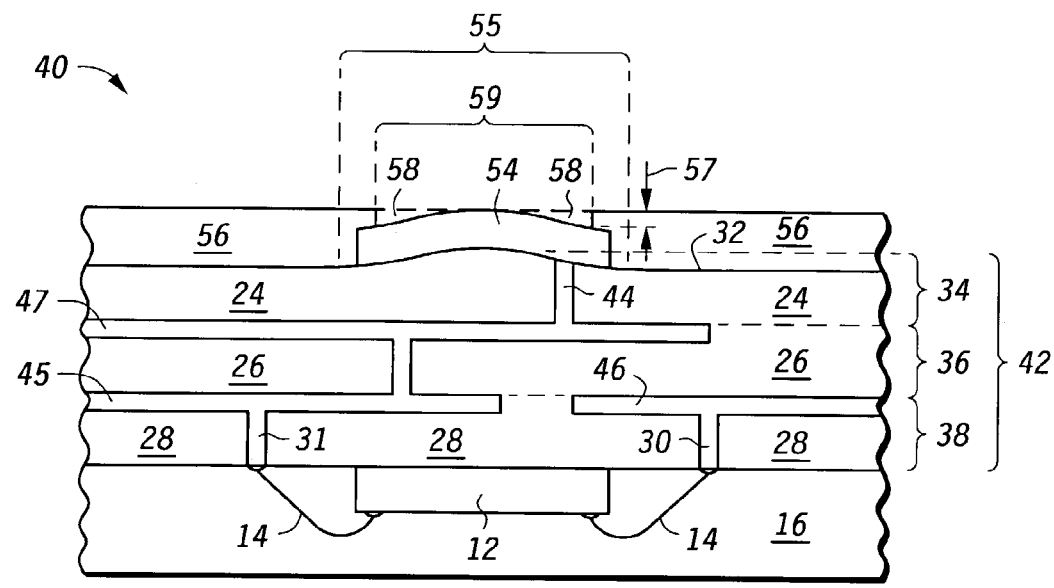
FIG. 4 illustrates a cross-sectional view of the semiconductor package of FIG. 3 after selectively etching the conductive layer to form a solder mask defined electrically conductive surface in accordance with one embodiment of the present invention.

FIG. 4 illustrates a cross-sectional view of semiconductor package 40 after removal (e.g. etching) of conductive layer 48, removal of patterned masking layer 50, an d formation of solder mask 56. After formation of patterned masking layer 50 of FIG. 3, conductive layer 48 is etched to form conductive surface 54 which, in the illustrated embodiment, is conformal to surface 32 of package substrate 42. After etching conductive layer 48 using conventional processing, patterned masking layer 50 is removed using conventional processing. After removal of patterned masking layer 50, solder mask 56 is formed. As illustrated in FIG. 4, semiconductor package 40 is a solder defined mask where the openings in solder mask 56 (such as opening 59) expose at least a portion of conductive surface 54. Alternatively, note that semiconductor package 40 may be a non-solder defined mask where the opening in solder mask 56 would surround conductive surface 54 (as shown by reference numeral 55). Solder mask 56 may be formed using conventional processes and materials as known in the art. Opening 59 (or opening 55 in the case of a non-solder defined mask) within solder mask 56 may have any variety of shapes. For example, the opening may be a square opening, round opening, oval opening, or be of any other shape (such as when viewed from a top down view).

In one embodiment, the conductive surfaces, such as conductive surface 54, and solder mask 56 may be included as part of package substrate 42. For example, conductive surface 54 may be part of interconnect layer 34. Alternatively, solder mask 56 may not be present at all. Also note that the sidewall edges of the opening in solder mask 56 used to expose conductive surface 54 may be perpendicular, as illustrated, or, alternatively, may be sloped. Electrically conductive surface 54 may be formed of any conductive material (as was described in reference to conductive layer 48) and may also be referred to as an electrically conductive material. In one embodiment, conductive surface 54 may be a solderable conductive material. Note also that conductive surface 54 may be formed in a variety of different ways, such as by selectively depositing or forming a conductive material, such as, for example, solder, overlying all or portions of the angulated portions of surface 32. Also, note that conductive surface 54 may have any shape, such as, for example, a square or round shape (such as when viewed from a top down view).

After formation of conductive surface 54 and solder mask 56 (if present), a semiconductor die 12 is attached to a surface of package substrate 42. In the illustrated embodiment, semiconductor die 12 is attached to a second surface of package substrate 42 opposite first surface 32 (i.e. opposite the surface on which conductive surface 54 is formed). Also, in the illustrated embodiment, there is no solder mask on the second surface of package substrate 42, opposite first surface 32, though other embodiments may have a solder mask layer. The interlayer and intralayer conductive portions of package substrate 42 therefore provide electrical connections between semiconductor die 12 and conductive surface 54. Therefore, note that although FIG. 4 illustrates only one electrically conductive surface 54, semiconductor package 40 may include any number of electrically conductive surfaces such as surface 54 to provide the desired electrical connections to semiconductor die 12. Similarly, surface 32 of package substrate 42 may include any number of angulated surface portions such as portion 43 (as was described in reference to FIG. 2) such that they correspond to the places where the conductive surfaces are to be formed.

Also, as illustrated in FIG. 4, semiconductor die 12 is electrically connected to interlayer conductive portions 31 and 30 at the second surface of package substrate 42 via electrically conductive wire bonds 14. Therefore, semiconductor die 12 is electrically connected to conductive surface 54 via a wire bond connection and conductive portions 44, 47, 45, and 31 through package substrate 42. Therefore, note that semiconductor die 12 may include any number of wire bond connections to the second surface of package substrate 42 which may then be routed (by conductive interlayer and intralayer conductive portions) to conductive surfaces at the first surface (surface 32) of package substrate 42. Semiconductor package 40 also includes a package mold compound 16 surrounding semiconductor die 12 and wire bonds 14.

Note that although FIG. 4 illustrates semiconductor die 12 wire bonded to the first surface of package substrate 12, alternate embodiments may use other methods to provide electrical connections from semiconductor die 12 to conductive surface 54. For example, alternate embodiments may use electrically conductive epoxies, flip chip technologies, bump technologies, etc., as known in the art. Also, FIG. 4 illustrates only one semiconductor die, however, alternate embodiments may include more than one semiconductor die either stacked or next to each other. Furthermore, although FIG. 4 illustrates semiconductor die 12 on the second side of package substrate 42, opposite the first side having conductive surface 54, alternate embodiments may include the semiconductor die on the same side as the side having conductive surface 54 (such as in a tape ball grid array package). Furthermore, alternate embodiments may include one or more die on both sides of package substrate 42. In yet other embodiments, semiconductor die 12 may be located within cavities formed on either side of package substrate 42, as will be described below in reference to FIG. 8.

Semiconductor die 12 may include any type of semiconductor substrate, such as, for example, a silicon substrate, a gallium substrate, a gallium arsenic substrate, etc. or any type of optical substrate, such as, for example, fused silica, borosilicate glass, quartz, etc. Also, as mentioned above, package substrate 42, may include any number of interconnect layers as needed to route electrical signals from semiconductor die 12 to the conductive surfaces at the first surface of package substrate 42, such as conductive surface 54.

Still referring to FIG. 4, note that due to the angular surface portions of package substrate 42, the resulting conductive surface 54 in opening 59 is an electrically conductive angulated or non-planar solderable surface in which a central portion is elevated more than an outlying portion. (Also note that as used herein, angulated surfaces includes those surfaces having any type of angular shapes, including those that approximate spherical, curved, or other relatively smooth shapes.) Therefore, the non-planar first surface (surface 32) of package substrate 42 may be used to form angulated or non-planar conductive surfaces within some or all of the openings of solder mask 56 such that at least one portion of the conductive surface within a solder mask opening extends higher than a remaining portion of the conductive surface. In the embodiment of FIG. 4, a central portion of conductive surface 54 is raised as compared to outlying portions of conductive surface 54. Also, in the embodiment of FIG. 4, the raised portion of conductive surface 54 is approximately level with an exterior plane of solder mask 56. However, in alternate embodiments, the raised portion (or portions) of conductive surface 54 may extend higher than or may be below the exterior top surface of solder mask 56.

In the embodiment of FIG. 4, note that conductive surface 54 extends laterally within opening 59 but does not completely fill a volume defined by a height 57 of opening 59 and the surface area of opening 59, thus forming a gap 58. In the illustrated embodiment, gap 58 is formed between the raised central portion of conductive surface 54 and the sidewalls of solder mask 56 within opening 59. Note that the size and location of gap 58 depends on the degree and shape of the non-planarity of underlying package substrate 42. Furthermore, gaps similar to gap 58 can be formed anywhere in the mask openings by using different non-planar package substrates having, for example, different patterns of angulated portions. Also, gaps such as gap 58 allow for an improved solder joint and improved standoff and pitch, as will be described below in reference to FIGS. 9 and 10 Note also that due to the non-planar surface of package substrate 42, solder or other additional conductive materials are not necessary to produce an angulated conductive surface within the solder mask openings. Also note that in one embodiment, the angulated conductive surface (such as conductive surface 54) does not extend beyond (i.e. higher than) the exterior plane of the solder mask by more than 50 percent of the thickness of the solder mask (such as solder mask 56).

Figure 5:
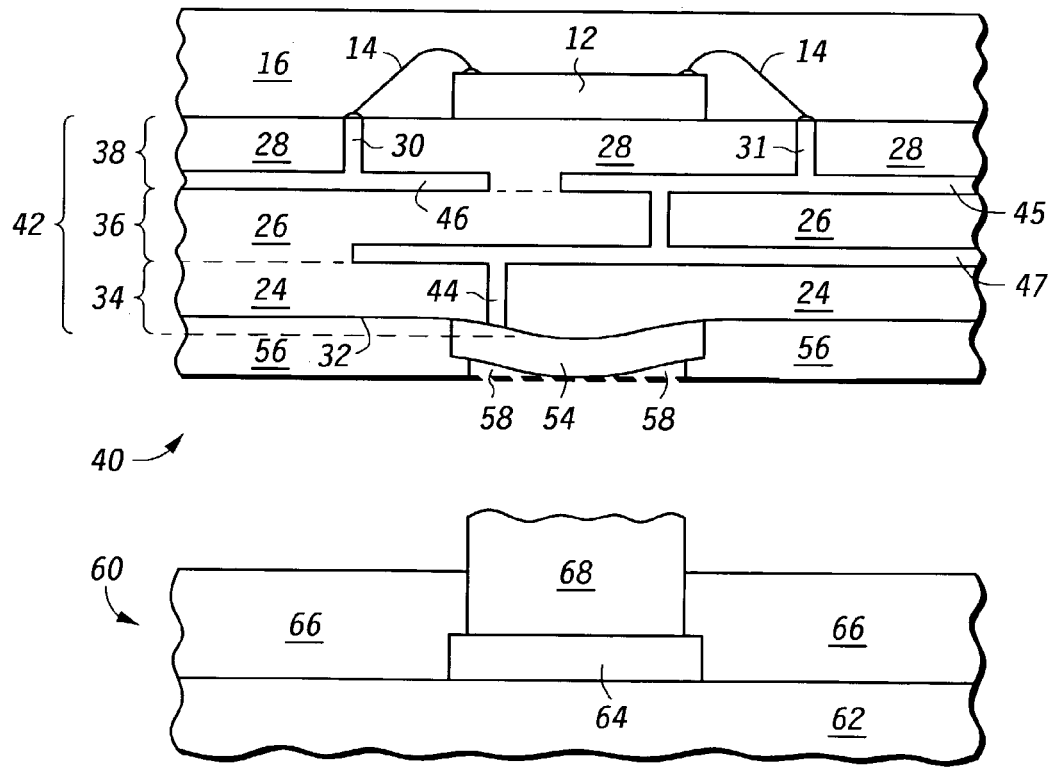
FIG. 5 illustrates a cross-sectional view of the semiconductor package of FIG. 4 and a cross-sectional view of a printed circuit board (PCB) in accordance with one embodiment of the present invention.

FIG. 5 illustrates a cross-sectional view of semiconductor package 40 (inverted) and a cross-sectional view of a PCB 60. PCB 60 includes a PCB substrate 62, such as, for example, a laminate, fiber glass reinforced plastic material, or any other ceramic or organic substrate. PCB 60 includes a conductive surface 64 overlying a first surface of PCB substrate 62. Conductive surface 64 can be formed of any conductive material or combination of conductive materials. For example, conductive surface 64 may be formed from copper, gold, silver, aluminum, palladium, tin, lead, nickel, tungsten, or any other conductive metal or metal alloy. Alternatively, conductive surface 64 may be formed from a conductive polymer. PCB 60 also includes a solder mask 66 having an opening that exposes at least a portion of conductive surface 64. Therefore, as illustrated in FIG. 9, PCB 60 is a solder defined mask. However, in an alternate embodiment, PCB 60 may be a non-solder defined mask where the openings of solder mask 66 surround conductive surface 64. In yet an alternate embodiment, solder mask 66 may not be present. Also, although only one conductive surface is illustrated, PCB 60 may include any number of conductive surfaces such as conductive surface 64 necessary to provide electrical connections to the conductive surfaces of semiconductor package 40 which then provide electrical connections to semiconductor die 12. PCB 60 also includes solder paste 68 over the exposed portion of conductive surface 64 within the opening of solder mask 66. Solder paste 68 may be applied to PCB 60 using conventional processes as known in the industry. Also note that alternate embodiments may use other conductive materials other than solder for providing electrical connections to semiconductor package 40.

Figure 6:
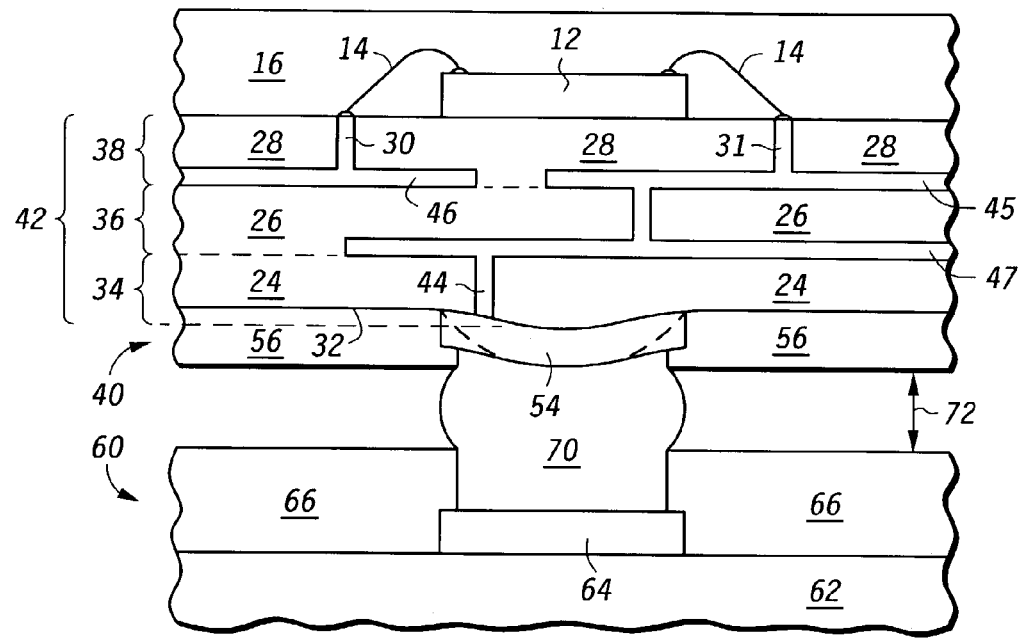
FIG. 6 illustrates a cross-sectional view of the semiconductor package and PCB of FIG. 5 after joining in accordance with one embodiment of the present invention.

FIG. 6 illustrates a cross-sectional view of semiconductor package 40 and PCB 60 after semiconductor package 40 has been placed on and in physical contact with PCB 60 (such that solder paste 68 lined up with conductive surface 54) and the assembly has been reflowed. The solder joint 70 joins in a mechanical and electrical fashion semiconductor package 40 to PCB 60. The angulated conductive surface 54 (and gap 58) allows for an improved solder joint because it becomes easier for solder paste 68 to contact conductive surface 54. That is, the solder paste does not have to enter the entire depth of the mask opening to effectively contact conductive surface 54. The ability to better contact conductive surface 54 allows solder paste 68 to properly reflow and join to conductive surface 54 to create a more reliable solder joint 70. Also, the resulting standoff height 72 between solder mask 66 and solder mask 56 is reduced (in some embodiments, it is reduced all the way to zero such that PCB 60 is in direct physical contact with solder mask 56) allowing for the assembled unit to be used for applications needing thin profiles. This is accomplished by using a non-planar package substrate having angulated portions over which solderable conductive surfaces may be formed (such as conductive surface 54) in place of solder balls commonly used in the art of packaging technology. Solder balls used today are generally large which increases the standoff height, thus making a solder ball solder joint not ideal for thin profile applications. Furthermore, the use of conductive layer 54 over non-planar package substrate 42 avoids the need for extra solder on conductive layer 54 for connection to PCB 60 (which also allows for reduced pitch). However, note that in an alternate embodiment, a reflowed solder material may be formed over conductive layer 54 prior to attachment to PCB 60. Note also that in alternate embodiments, the edges of conductive surface 54 may be tapered as illustrated by the dotted lines 54 rather than perpendicular to surface 32.

Note that in alternate embodiments, package substrate 42 may also include angulated portions such as angulated portion 43 on either the first or second side or both sides of package substrate 42 such that angulated conductive surfaces may be formed on either or both sides of package substrate 42. Note also that other conductive or solderable surfaces may be formed over the angulated portions of package substrate 42 to provide the electrical connections, and that these conductive or solderable surfaces may be formed using a variety of materials and processes. Note that the conductive surfaces, such as conductive surface 54, may be formed such that they overly either all or only a portion of each of the angulated surface portions.

Figure 7:
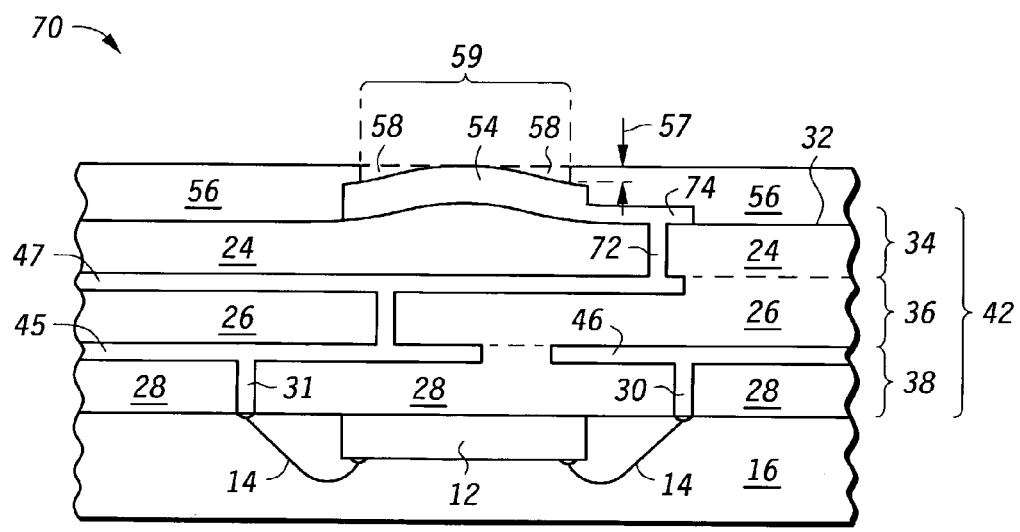
FIG. 7 illustrates a cross-sectional view of an alternate embodiment of the semiconductor package of FIG. 4.

FIG. 7 illustrates a cross-sectional view of a semiconductor package 70 which provides an alternate embodiment for semiconductor package 40 of FIG. 4. Note that similar numbers used in FIGS. 4 and 7 indicate like or similar elements. In the embodiment of FIG. 7, note that interconnect layer 34 includes interlayer conductive portion 72 rather than interlayer conductive portion 44 where interlayer conductive portion 72 provides an electrical connection to surface 32 of package substrate 42 at a location offset from conductive surface 54. Therefore, an interlayer conductive portion 74 may be used to route the signal from interlayer conductive portion 72 to conductive surface 54, where, in one embodiment, interlayer conductive portion 74 may be considered as being part of interconnect layer 34. (Note also that in some embodiments, conductive surface 54 is also considered as being part of interconnect layer 34.) Therefore, note that the angulated portions of package substrate 42 can be located in a variety of different locations, depending on the desired locations of the conductive surfaces such as conductive surface 54, where the angulated portions may include interlayer conductive portions (such as 44) or may not include any interlayer conductive portions. For example, as seen in FIG. 7, the angulated portion of surface 32 is formed from just the insulating portions 24 of interconnect layer 34. However, as was described in reference to FIGS. 1–4, an interlayer conductive portions such as portion 44 may be formed within the angulated portion such that it connects to a central portion of conductive surface 54 or a peripheral portion of conductive surface 54.

Figure 8:
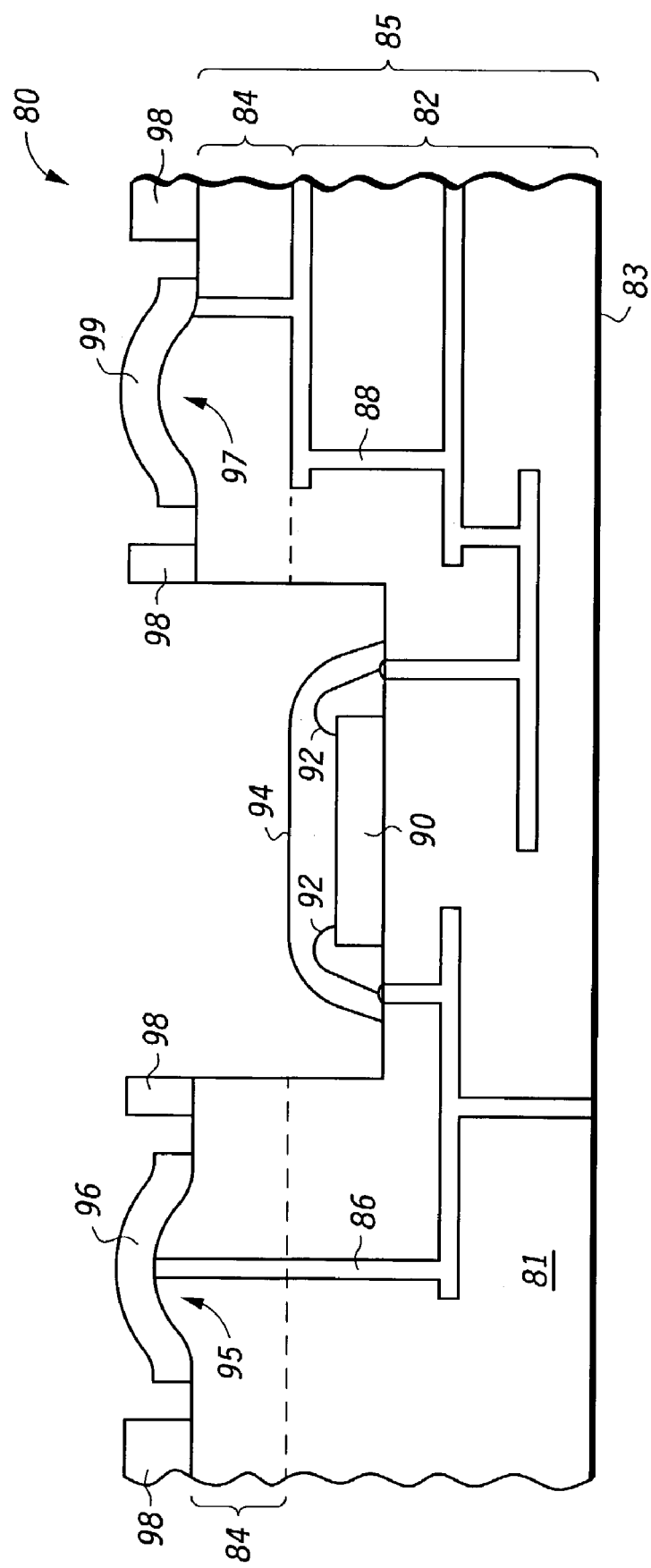
FIG. 8 illustrates a cross-sectional view of a semiconductor package having a cavity in accordance with another embodiment of the present invention.

FIG. 8 illustrates a semiconductor package 80 in accordance with another embodiment of the present invention. As described above in reference to FIG. 4, in alternate embodiments, semiconductor die 12 may be located within cavities formed on either side of package substrate 42. Referring to FIG. 8, semiconductor package 80 is illustrated which includes a cavity in a first surface of a package substrate 85 having a semiconductor die 90 formed therein. Semiconductor package 80 includes a package substrate 85 having angulated portions 95 and 97 on its first surface, wherein the angulated portions and the semiconductor die are located on a same side of package substrate 85. Angulated portions 95 and 97 have a conductive surface 96 and 99, respectively, formed thereon, where the conductive surfaces 96 and 99 are non-solder mask defined. That is, they are surrounded by openings in a solder mask layer 98 which overlies portions of the first surface of semiconductor package 85 surrounding the cavity containing semiconductor die 90. Semiconductor package 85 includes interconnect layer 84 and interconnect layer or layers 82. That is, interconnect layer 82 may include any number of interconnect layers as needed to route signals through semiconductor substrate 85. In the illustrated embodiment, semiconductor package 85 includes conductive portions 86 and 88 which route signals within interconnect layers 82 and 84. Semiconductor package 85 also includes insulating material 81 which electrically isolates the conductive portions, as needed. Wire bonds 92 provide electrical connections between semiconductor die 90 and conductive portions 86 and 88 in order to route signals from semiconductor surfaces 96 and 99 to semiconductor die 90. Semiconductor package 80 also includes a package mold compound 94 surrounding semiconductor die 90 and wire bonds 92.

In the illustrated embodiment of FIG. 8, note that the elevated portions of conductive surfaces 96 and 99 (due to angulated portions 95 and 97 of package substrate 85) extend beyond an exterior plane of solder mask 98. However, note that in alternate embodiments, these elevated portions of conductive surfaces 96 and 99 may be level with the exterior plane of solder mask 98 or may be lower than the exterior plane of solder mask 98. Note also that that angulated portions such as angulated portions 95 and 97 may also be formed on a second surface 83 of package substrate 85 in addition to or in place of angulated portions 95 and 97. Therefore, as seen in FIG. 8, package substrate 85 may also provide electrical connections to surface 83 (such as illustrated by conductive portion 86).

Note that semiconductor package 85 with a cavity, as illustrated in FIG. 8, may be formed using conventional processes as known in the art. Also, the discussions provided above for conductive surface 54, solder mask 56, package substrate 42, semiconductor die 12, wirebonds 14, and package mold compound 16 also generally apply to conductive surfaces 96 and 99, solder mask 98, package substrate 85, semiconductor die 90, wirebonds 92, and package mold compound 94, respectively. That is, the same methods and materials for forming and the same alternate embodiments described above may be applied to the example of FIG. 8.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly, listed or inherent to such process, method, article, or apparatus.

The invention claimed is:

1. A semiconductor package comprising:
   a package substrate having a first surface and an opposite second surface having a plurality of surface portions that are angulated, the package substrate comprising a plurality of interconnect layers for routing signals;
   a semiconductor die positioned on the substrate;
   a mask overlying the second surface of the substrate, the mask having a plurality of mask openings; and
   an electrically conductive material that overlies each of the plurality of surface portions that are angulated, the electrically conductive material being selectively formed within each of the plurality of mask openings and on a portion of the second surface of the substrate, the electrically conductive material being electrically connected to the semiconductor die via a conductive interconnect through at least a portion of the substrate.

2. The semiconductor package of claim 1 wherein the electrically conductive material further comprises a non-planar conductive surface.

3. The semiconductor package of claim 1 wherein the electrically conductive material further comprises a non-planar conductive material that is elevated more in a central portion of each of the plurality of mask openings than at outlying portions of each of the plurality of mask openings.

4. The semiconductor package of claim 1 wherein the electrically conductive material overlying each of the plurality of surface portions that are angulated is electrically contacted to the semiconductor die from either a central portion or a peripheral portion of the electrically conductive material overlying each of the plurality of surface portions that are angulated.

5. The semiconductor package of claim 1 wherein the electrically conductive material overlies either all or only a portion of each of the plurality of surface portions that are angulated.

6. The semiconductor package of claim 1 wherein the electrically conductive material is one of at least copper, gold, aluminum, nickel, tin, tungsten, lead, silver or palladium.

7. The semiconductor package of claim 1 wherein the electrically conductive material further comprises:
   a conductor having a solderable surface, the conductor immediately overlying the second surface of the substrate; and
   a reflowed solder material immediately overlying the conductor.

8. The semiconductor package of claim 1 wherein the electrically conductive material further comprises a conductive polymer.

9. The semiconductor package of claim 1 wherein the electrically conductive material further comprises a metal.

10. The semiconductor package of claim 1 wherein the electrically conductive material forms an electrical interconnect.

11. The semiconductor package of claim 1 wherein the semiconductor die is positioned on a same side of the substrate as the plurality of surface portions that are angulated.

12. The semiconductor package of claim 1 further comprising:
   a board comprising either a solderable material or a conductive epoxy connected to the electrically conductive material for making electrical contact from the semiconductor die to the board.

13. The semiconductor package of claim 12 wherein the board is in direct physical contact with the mask.

14. The semiconductor package of claim 12 further comprising a gap between the board and the mask to form a standoff height.

15. The semiconductor package of claim 12 wherein the conductive interconnect further comprises conductive vias, traces and means for making electrical contact from the conductive vias to the semiconductor die.

16. The semiconductor package of claim 15 wherein the means for making electrical contact from the conductive vias to the semiconductor die further comprise at least one of wire bonds, conductive epoxy or conductive bumps.

17. The semiconductor package of claim 1 wherein the electrically conductive material is solder and the mask is a solder mask.

\* \* \* \* \*